(12) United States Patent
Takizawa et al.

(10) Patent No.: US 7,006,374 B2
(45) Date of Patent: Feb. 28, 2006

(54) MAGNETIC MEMORY DEVICE AND METHOD OF READING INFORMATION

(75) Inventors: Ryousuke Takizawa, Naka-gun (JP); Kenji Tsuchida, Kawasaki (JP); Yoshihisa Iwata, Yokohama (JP); Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/855,497

(22) Filed: May 28, 2004

(65) Prior Publication Data

US 2005/0180204 A1    Aug. 18, 2005

(30) Foreign Application Priority Data

Feb. 12, 2004  (JP)  ............... 2004-035402

(51) Int. Cl.
  *G11C 11/14* (2006.01)
(52) U.S. Cl. .................. 365/171; 365/158; 365/190
(58) Field of Classification Search ............ 365/171, 365/158, 190, 173, 209, 210, 207, 205
  See application file for complete search history.

(56) References Cited

U.S. PATENT DOCUMENTS

| 6,256,247 B1 * | 7/2001 | Perner ..................... 365/209 |
| 6,317,376 B1 * | 11/2001 | Tran et al. ................ 365/210 |
| 6,504,752 B1 * | 1/2003 | Ito ......................... 365/158 |
| 6,888,772 B1 * | 5/2005 | Hidaka ..................... 365/209 |
| 2003/0031046 A1 | 2/2003 | Hidaka |
| 2003/0227808 A1 * | 12/2003 | Sako ....................... 365/205 |
| 2004/0052107 A1 * | 3/2004 | Ohtani ..................... 365/171 |

OTHER PUBLICATIONS

Kohtaroh Gotoh, et al., et al., "A 0.9 V Sense-Amplifier Driver for High-Speed GB-Scale DRAMs", IEEE, Symposium on VLSI Circuits Digest of Technical Papers, Jun. 1996, pp. 108-109.

K-C. Lee, et al., "Low Voltage High Speed Circuit Designs for Giga-bit DRAMs", IEEE, Symposium on VLSI Circuits Digest of Technical Papers, Jun. 1996, pp. 104-105.

\* cited by examiner

*Primary Examiner*—Richard Elms
*Assistant Examiner*—Dang T. Nguyen
(74) *Attorney, Agent, or Firm*—Oblon, Spivak, McClelland, Maier & Neustadt, P.C.

(57) ABSTRACT

A memory cell of a magnetic memory device has an MTJ element and one end of the memory cell is selectively electrically connected to a ground potential line. A first bit line is electrically connected to the other end of the memory cell. A sense amplifier amplifies a difference in potential between the first bit line and a second bit line complementary to the first bit line so that the difference is equal to or larger than a difference between an internal power potential and a ground potential. A connection circuit disconnects the MTJ element from an electric connection between the ground potential line and the sense amplifier.

17 Claims, 10 Drawing Sheets

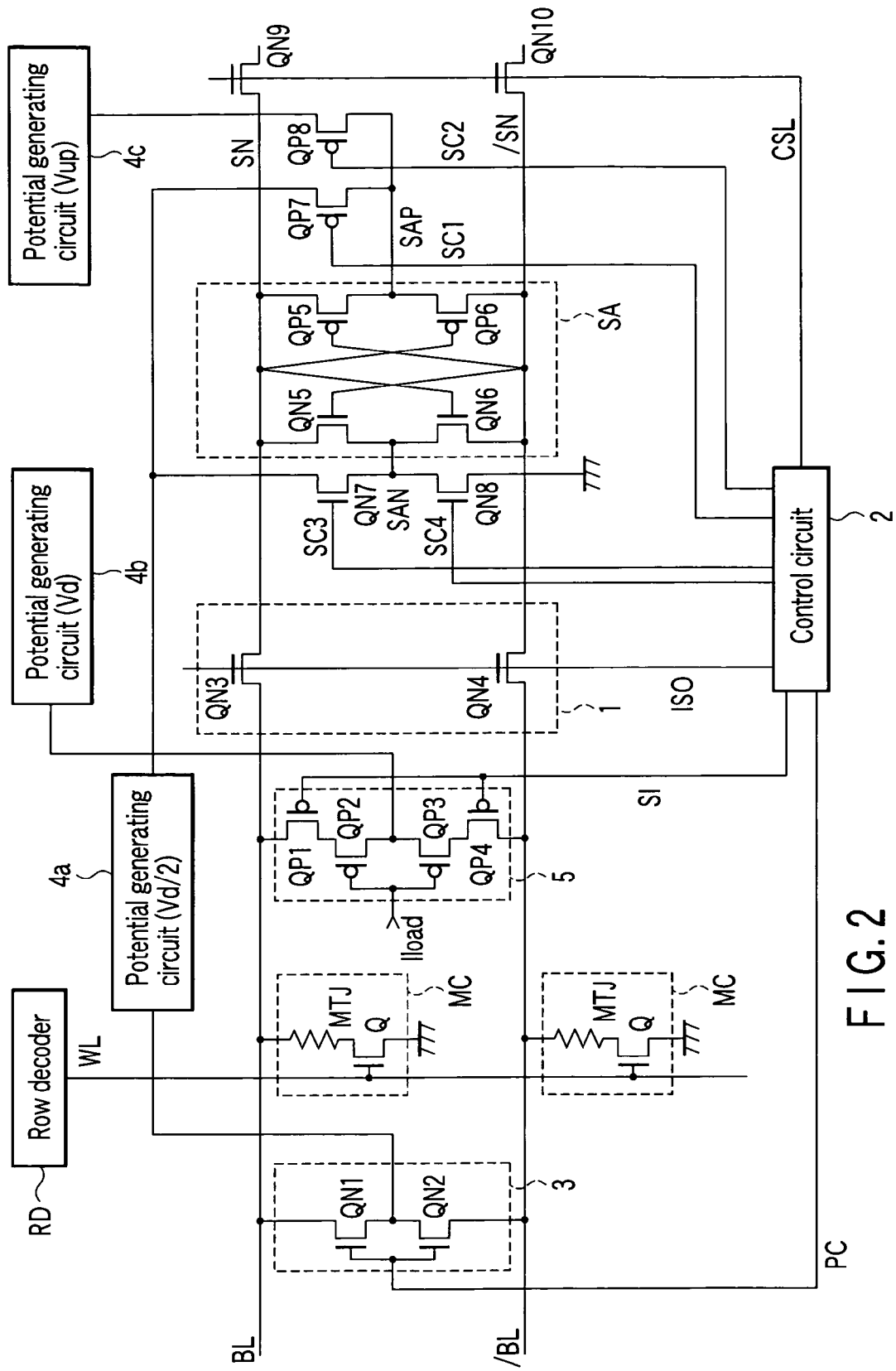
F I G. 2

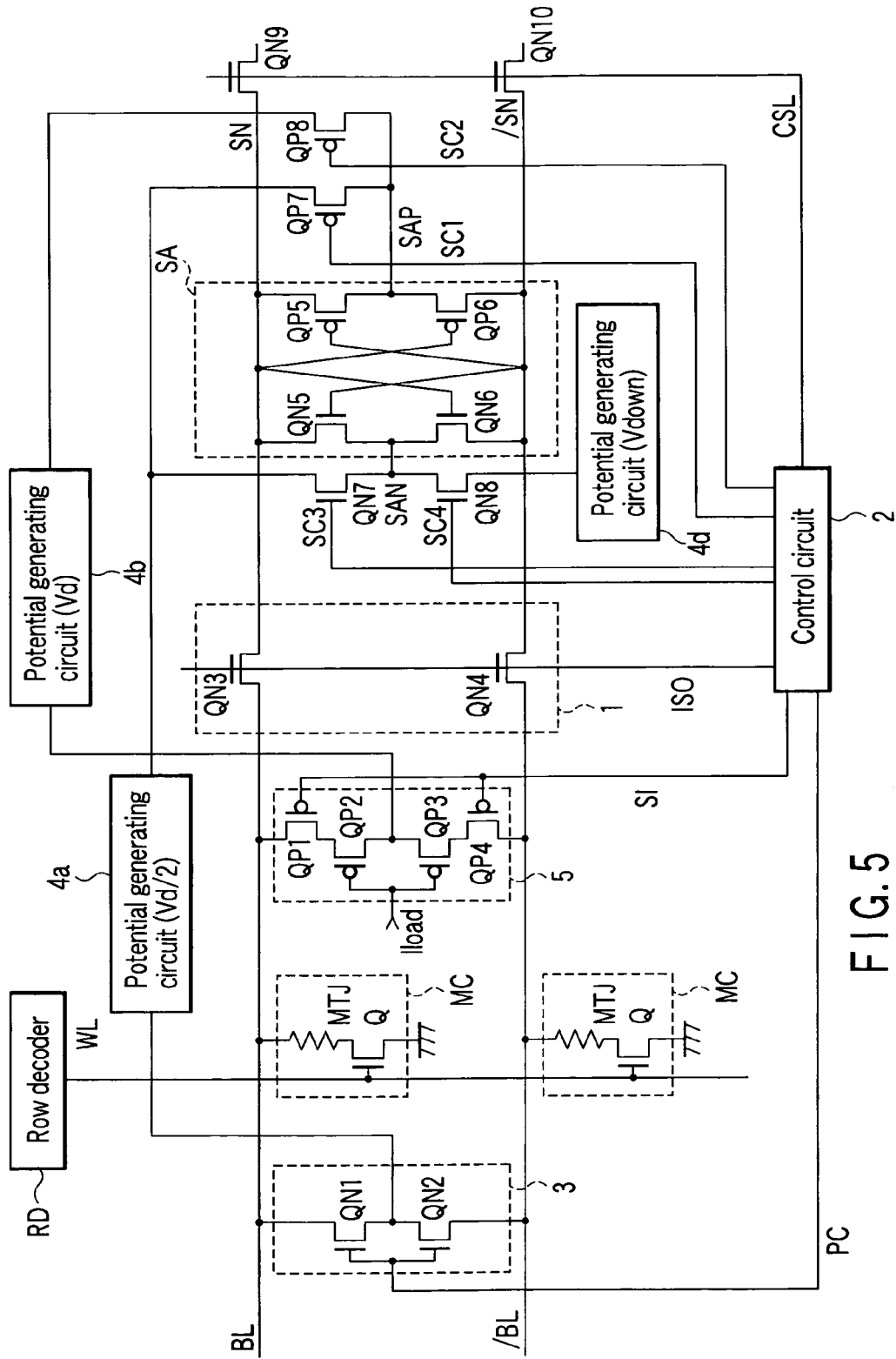
F I G. 5

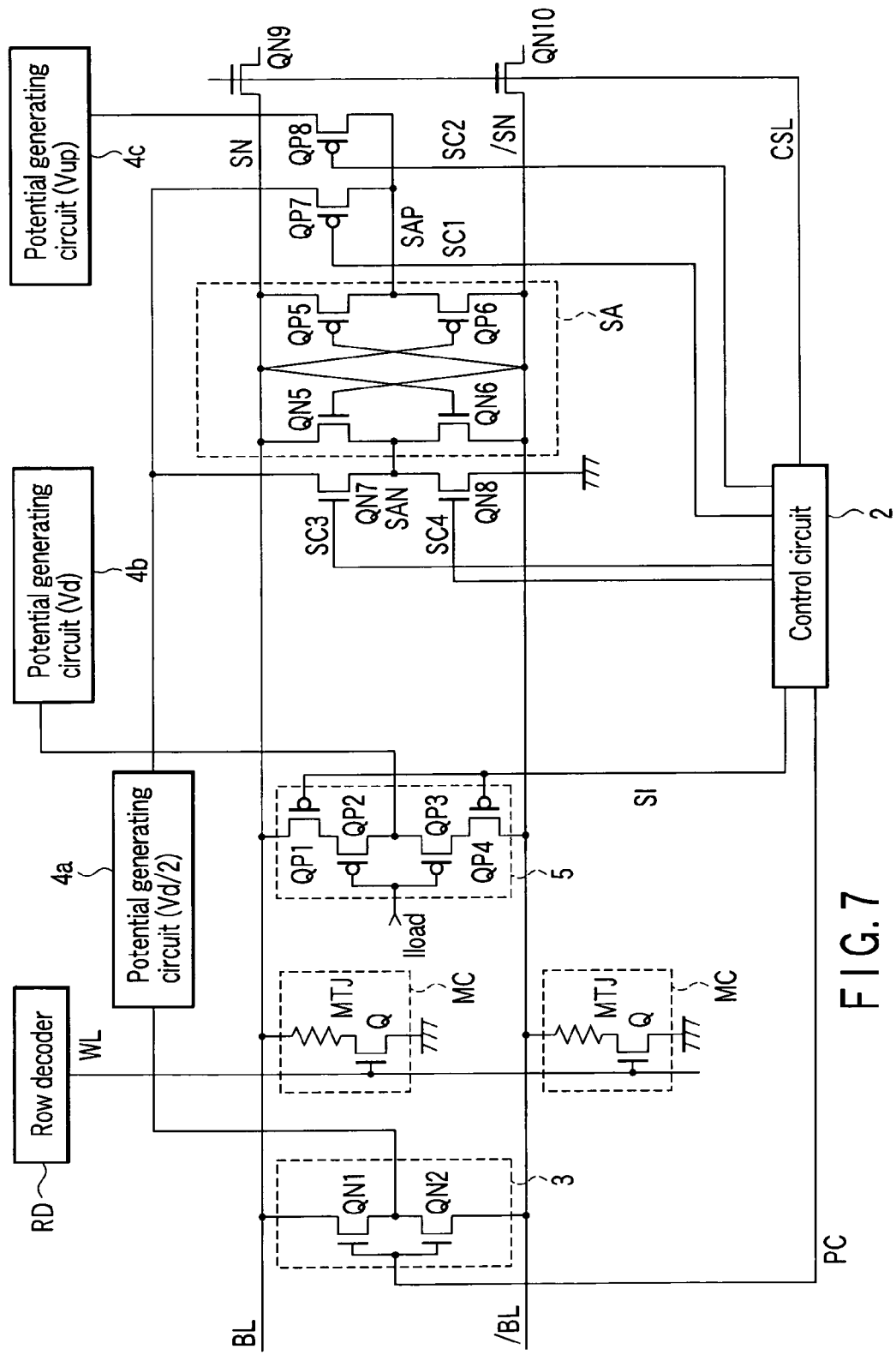
F I G. 7

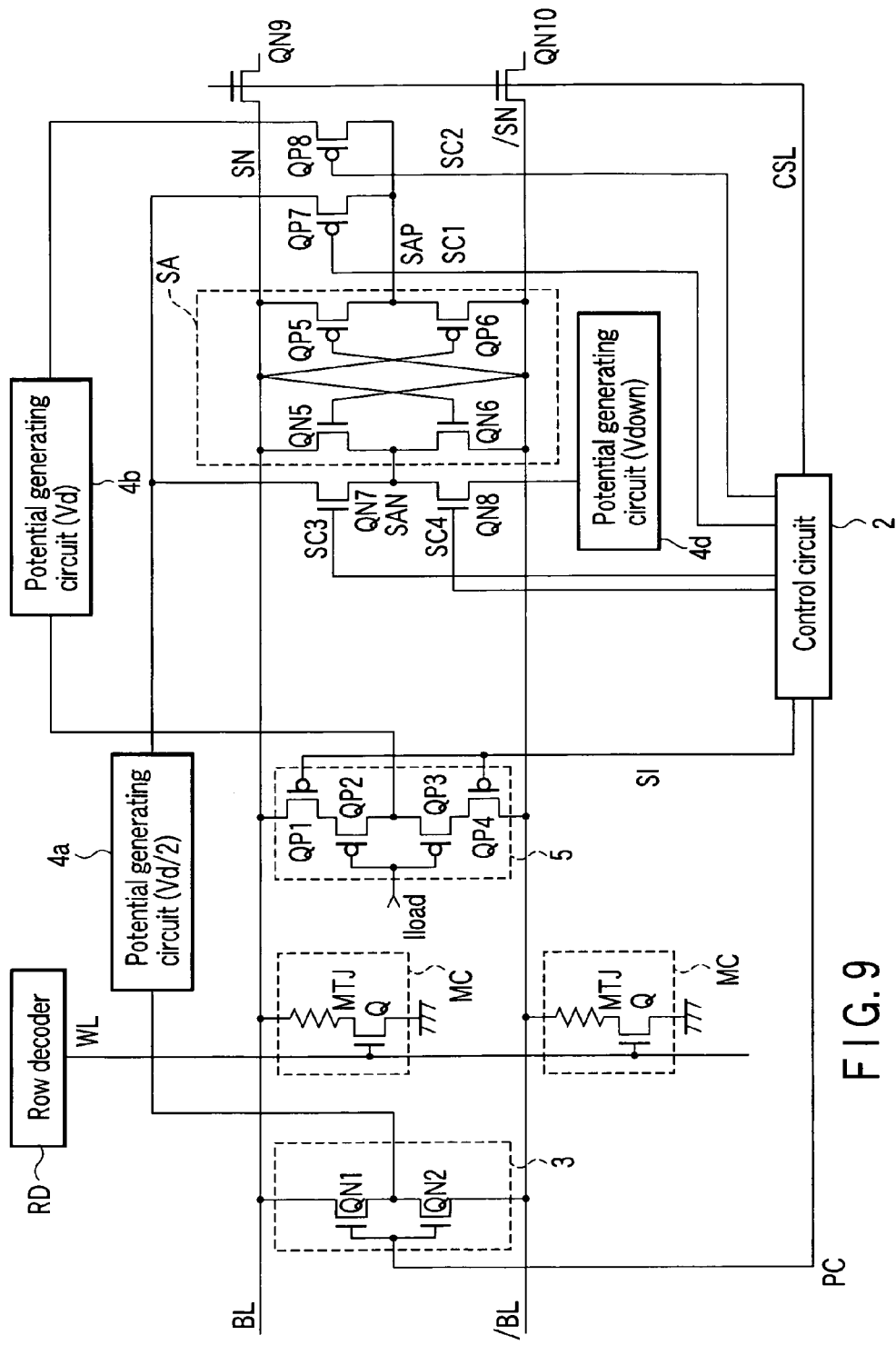
F I G. 9

MAGNETIC MEMORY DEVICE AND METHOD OF READING INFORMATION

CROSS-REFERENCE TO RELATED APPLICATIONS

This application is based upon and claims the benefit of priority from prior Japanese Patent Application No. 2004-035402, filed Feb. 12, 2004, the entire contents of which are incorporated herein by reference.

BACKGROUND OF THE INVENTION

1. Field of the Invention

The present invention relates to a magnetic memory device and a method of reading information, and in particular, to, for example, the circuit configuration of memory cell through read bit lines through in a magnetic memory device and a method of reading information from a magnetic memory device.

2. Description of the Related Art

Each cell in a magnetic random access memory (MRAM) using a tunneling magneto resistive (TMR) effect is composed of an magnetic tunnel junction (MTJ) element and a selection transistor having one end connected to the MTJ element and the other end connected to a ground potential line.

Information can be read from a magnetic memory device at a low voltage utilizing a good MR ratio. However, a sense amplifier is composed of a conventional n-type Metal Oxide Semiconductor (MOS) transistor or CMOS transistor, so that as the power voltage decreases and the bit line voltage correspondingly approaches its threshold, information may not be read at high speed or read operations are disabled. Thus, a mechanism is required which increases the amplitude of the sense amplifier with respect to the magnitude of a read signal, that is, the amplitude of bit lines. Such an overdrive technique for the sense amplifier is described in "A 0.9V Sense-Amplifier Driver for High-Speed Gb-Scale DRAMs", K. Gotoh et al., Symposium On VLSI cir., June, 1996, and "Low Voltage High Speed Circuit Designs for Giga-bit DRAMs", K-C Lee et al., Symposium On VLSI Cir. June, 1996. These techniques enable the read margin to be increased. However, these techniques relate to dynamic RAMs (DRAMs). Accordingly, if they are applied directly to an MRAM, the problem described below may occur. When these techniques are applied to an MRAM, a voltage amplified by overdriving read bit lines is applied to the MTJ element. As a result, the insulating film in the MTJ element may be degraded or damaged. This problem has come more marked particularly because MRAMs have been miniaturized to reduce the thickness of the insulating film in the MTJ element and thus the insulating withstand voltage (for example, 10 [MV/cm]).

BRIEF SUMMARY OF THE INVENTION

According to a first aspect of the present invention, there is provided a semiconductor device comprising: a memory cell having an MTJ element, one end of the memory cell selectively electrically connected to a ground potential line; a first bit line electrically connected to another end of the memory cell; a sense amplifier which amplifies a difference in potential between the first bit line and a second bit line complementary to the first bit line so that the difference is equal to or larger than a difference between an internal power potential and a ground potential; and a connection circuit which disconnects the MTJ element from an electric connection between the ground potential line and the sense amplifier.

According to a second aspect of the present invention, there is provided a semiconductor device comprising: a memory cell having an MTJ element; a first bit line electrically connected to the memory cell; a sense amplifier which amplifies a difference in potential between the first bit line and a second bit line complementary to the first bit line so that the difference is equal to or larger than a difference between an internal power potential and a ground potential; and a connection circuit which selectively electrically connects the sense amplifier and the MTJ element.

According to a third aspect of the present invention, there is provided a semiconductor device comprising: a memory cell having an MTJ element and a switching element which selectively electrically connects one end of the MTJ element to a ground potential line; a first bit line electrically connected to the memory cell; a sense amplifier which amplifies a difference in potential between the first bit line and a second bit line complementary to the first bit line so that the difference is equal to or larger than a difference between an internal power potential and a ground potential; and a control circuit which disconnects the switching element to float the memory cell before the sense amplifier amplifies the potential difference.

According to a fourth aspect of the present invention, there is provided a method of reading information comprising: reading out potential according to information contained in an MTJ element to a first bit line by electrically connecting the MTJ element to a ground potential line and the first bit line; disconnecting the MTJ element from electric connection between the ground potential line and a sense amplifier; and after the disconnection, amplifying a difference in potential between the first bit line and a second bit line complementary to the first bit line so that the difference is equal to or larger than a difference between an internal power potential and a ground potential.

BRIEF DESCRIPTION OF THE SEVERAL VIEWS OF THE DRAWING

FIG. 2 is a circuit diagram of essential parts of magnetic memory devices according to the first embodiment of the present invention;

FIG. 5 is a diagram showing the circuit configuration of essential parts of the magnetic memory device according to a second embodiment of the present invention;

FIG. 7 is a diagram showing the circuit configuration of essential parts of a magnetic memory device according to a third embodiment of the present invention;

FIG. 9 is a diagram showing the circuit configuration of essential parts of a magnetic memory device according to a fourth embodiment of the present invention;

DETAILED DESCRIPTION OF THE INVENTION

Figure 1:
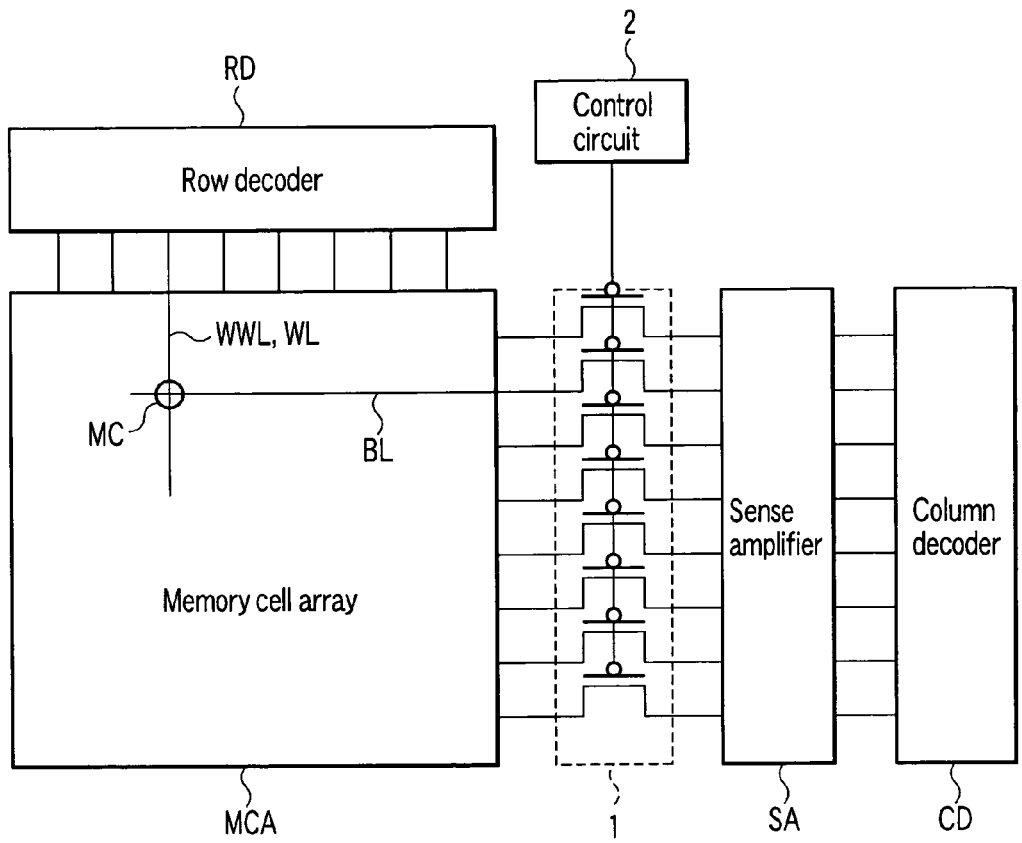
FIG. 1 is a block diagram showing a magnetic memory device according to a first embodiment of the present invention.

Embodiments of the present invention will be described below with reference to the drawings. In the description below, components having the same functions and configurations are denoted by the same reference numerals. Duplicate descriptions will be given only when required.

(First Embodiment)

FIG. 1 is a block diagram showing a magnetic memory device according to a first embodiment of the present invention. As shown in FIG. 1, a memory cell array MCA is provided which has memory cells MC arranged, for example, in a matrix. Each memory cell MC is composed of an MTJ element and a selection transistor (neither of which are shown). The MTJ element has a stacked structure including two ferromagnetic films and an insulating film sandwiched between the ferromagnetic films. The MTJ element records information utilizing a variation in magnetic resistance based on a spin polarization tunnel effect.

A bit line BL and a write word line WWL are provided so as to sandwich the two ferromagnetic layers between the lines with the MTJ element located at an intersection and with a space between each line and the layers. A read word line WL is connected to the gate of the selection transistor to select the memory cell MC. The potentials on the read word line WL and write word line are controlled by a row decoder RD.

Information is written to the MTJ element by the bit line BL and the write word line WWL by using a synthetic magnetic field to change a relative direction between the spins in the two ferromagnetic films. Information is read from the MTJ element by applying a voltage between the two ferromagnetic films in the selected cell and reading a resistance value from a current flowing through the ferromagnetic films. Alternatively, it is possible to allow a constant current to flow through the MTJ element in the selected cell and then to read the voltage between the two ferromagnetic films.

Each memory cell MC is connected to the bit line BL. A memory cell connection control circuit 1 is provided on the bit lines BL between the memory cell array MCA and the sense amplifier SA. The memory cell connection control circuit 1 provides such control as connection or disconnection of each of paths in accordance with control by a control circuit 2. The sense amplifier is provided for each pair of bit lines. A column decoder CD controls the potentials of the bit lines so that only predetermined bit lines (bit line pairs) are operated in accordance with an externally supplied address signal.

In short, a read operation is performed as described below. First, the row decoder RD selects the world line WL connected to a target memory cell MC. Then, a read voltage is applied to the target memory cell MC. The column decoder CD operates so as to activate the sense amplifier SA connected to the bit line connected to this memory cell MC. Then, the sense amplifier SA amplifies the potential on the bit line BL to read data from the bit line BL.

FIG. 2 shows the circuit configuration of essential parts of the magnetic memory device in FIG. 1. As shown in FIG. 2, the bit line BL and a bit line /BL (the symbol / denotes negative logic; this applies to the description below) complementary to the bit line BL are provided. A precharge circuit 3 is connected between the bit lines BL and /BL and fixes the bit lines BL and /BL at a predetermined potential, for example, an intermediate value Vd/2 between an internal power potential Vd and the ground potential Vss in a standby state. Lowering the power potential Vcc may generate the internal power potential Vd. The precharge circuit 3 is composed of, for example, two n-type MOS transistors QN1 and QN2 connected in series. The connection node between the transistors QN1 and QN2 is connected to a potential generating circuit 4a that supplies the potential Vd/2. A signal line PC is connected to gates of the transistors QN1 and QN2. A signal (potential) on the signal line PC is controlled by the control circuit 2.

The memory cell MC is connected to each of the bit lines BL and /BL. The memory cell MC is composed of an MTJ element MTJ and a selection transistor Q connected in series. The read word line (hereinafter simply referred to as a word line) WL is connected to a gate of the selection transistor Q. An end of the MTJ element MTJ which is opposite the connection node between the MTJ element MTJ and the selection transistor Q is connected to the bit line BL (bit line /BL). An end of the selection transistor which is opposite the connection node between the selection transistor and the MTJ element is grounded.

A read potential supplying circuit 5 is connected between the bit lines BL and /BL. The read potential supplying circuit 5 applies a read potential (internal power potential Vd–ground potential Vss) to the memory cell MC and setting the potentials on the bit lines BL and /BL at a reference potential (for example, the potential Vd/2). The read potential supplying circuit 5 is composed of, for example, four p-type MOS transistors QP1 to QP4 connected in series. A signal line SI is connected to gates of the transistors QP1 and QP4. A signal on the signal line SI is controlled by the control circuit 2. The connection node between the transistors QP2 and QP3 is connected to a potential generating circuit 4b that supplies the internal power potential Vd. A current Iload supplied by a current mirror current source is supplied to the transistors QP2 and QP3.

The memory cell connection control circuit 1 is inserted into the path of the bit lines BL and /BL. Specifically, the bit lines BL and /BL are separated into a memory cell side of the memory cell connection control circuit 1 (bit lines BL and /BL) and a sense amplifier side of the memory cell connection control circuit 1 (signal lines SN and /SN). The memory cell connection control circuit 1 controls the connection between the bit line BL and the signal line SN and the connection between the bit line /BL and the signal line /SL in accordance with a signal on a signal line ISO. The signal on the signal line ISO is controlled by the control circuit 2. The memory cell connection control circuit 1 is typically composed of n-type MOS transistors QN3 and QN4 provided on the bit lines BL and /BL, respectively. The signal line ISO is connected to gates of the transistors QN3 and QN4.

The sense amplifier SA is connected between the signal lines BL and /BL. The sense amplifier SA has an overdrive function of amplifying the difference in potential between the bit lines BL and /BL so that the difference is equal to or larger than the difference between the internal power potential Vd and the ground potential Vss. Specifically, a potential generating circuit 4c supplies a sense amplifier supply potential Vup (=Vd +Δ) to the sense amplifier SA. The sense amplifier SA thus sets the potential of one of the bit lines BL and /BL at Vss and amplifies the potential of the other to Vup. The potential Vup can be generated by boosting the internal power potential Vd. Alternatively, the power potential Vcc may be directly used.

The sense amplifier SA is composed of, for example, two n-type MOS transistors QN5 and QN6 connected in series and two p-type MOS transistors QP5 and QP6 connected in series. The transistors QN5 and QN6 are connected between the signal lines SN and /SN. Likewise, the transistors QP5 and QP6 are also connected between the signal lines SN and /SN. Gates of the transistors QN5 and QP5 are connected to the signal line /SN. Gates of the transistors QN6 and QP6 are connected to the signal line SN.

The connection node between the transistors QP5 and QP6 is connected to one end of each of the p-type transistors QP7 and QP8. A potential generating circuit 4a supplies the potential Vd/2 to the other end of the transistor QP7. A potential generating circuit 4c supplies the potential Vup to the other end of the transistor QP8. Gates of the transistors QP7 and QP8 are connected to signals SC1 and SC2, respectively. Signals on the signal lines SC1 and SC2 are controlled by the control circuit 2.

The connection node between the transistors QN5 and QN6 is connected to one end of each of the n-type transistors QN7 and QN8. The potential generating circuit 4a supplies the potential Vd/2 to the other end of the transistor QN7. The other end of the transistor QN8 is grounded. Gates of the transistors QN7 and QN8 are connected to signals SC3 and SC4, respectively. Signals on the signal lines SC3 and SC4 are controlled by the control circuit 2.

The other ends of the signal lines SN and /SN are connected to the respective data lines (not shown) via transistors QN9 and QN10. A signal line CSL from the control circuit 2 is connected to gates of the transistors QN9 and QN10.

Figure 3:
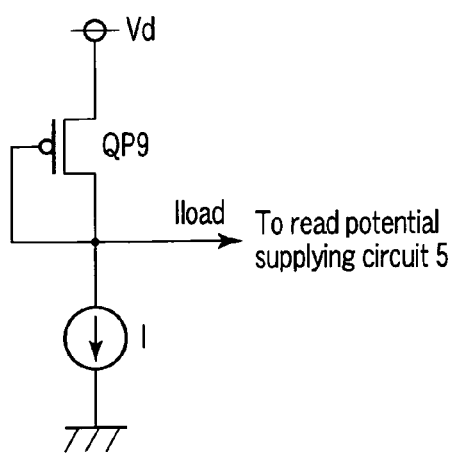
FIG. 3 is a circuit diagram showing a current mirror current source circuit.

FIG. 3 is a circuit diagram showing the current mirror current source circuit. An output from the current mirror current source circuit in FIG. 3 generates the current Iload supplied to the read potential supplying circuit 5 in FIG. 2. As shown in FIG. 3, one end of a p-type MOS transistor QP9 connects to an end of the current mirror current source circuit which is connected to the potential generating circuit 4b, which generates the potential Vd. The other end of the transistor QP9 constitutes an output end and is grounded via a constant current source I. The other end of the transistor QP9 is also connected to the gate of the transistor QP9.

Figure 4:
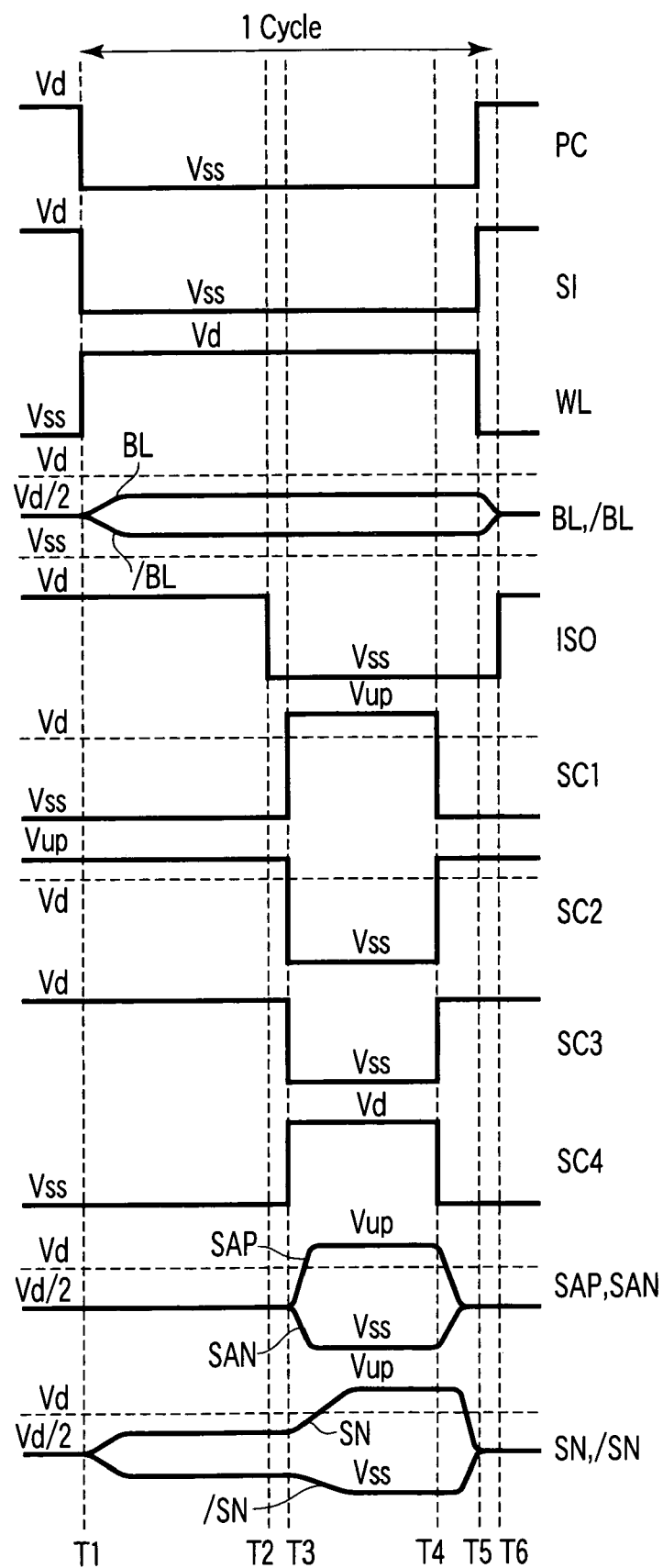
FIG. 4 is a timing chart showing the potentials of essential parts of the magnetic memory device according to the first embodiment of the present invention.

Now, the operation of the magnetic memory device in FIG. 2 will be described with reference to FIG. 4. FIG. 4 is a timing chart showing the potentials of essential parts of the magnetic memory device in FIG. 2. An example will be described in which the two MTJ elements MTJ store respective pieces of information complementary to each other and in which two memory cells store one bit of information. Specifically, "0" information means the case in which the memory cell MC connected to the bit line BL stores "0" information, whereas the memory cell connected to the bit line /BL stores "1" information. The opposite case corresponds to "1" information. Accordingly, it is assumed that before the read operation described below, the complementary pieces of information are already stored in the two memory cells MC.

As shown in FIG. 4, during standby, the potential on the signal line PC (hereinafter simply referred to the signal line PC; this applies to the description below) is at a high level (potential Vd), so that the precharge circuit 3 is on. The bit lines BL and /BL have the potential Vd/2. The signal SI is at the high level, so that the read potential supplying circuit 5 is off. The word line WL is at a low level (potential Vss). The signal ISO is at the high level. Thus, the bit line BL and the signal line SN are connected together, and the bit line /BL and the signal line /SN are connected together. As a result, the potentials on the bit lines BL and /BL is the same as those of the signals SN and /SN, respectively.

Furthermore, the signals SC1 and SC4 have the potential Vss. The signal SC2 has the potential Vup. The signal SC3 has the potential Vd. Accordingly, the potential (sense amplifier supply potential) SAN of the connection node between the transistors QN5 and QN6 and the potential (sense amplifier supply potential) SAP of the connection node between the transistors QP5 and QP6 each have a value of Vd/2.

When information is read, at a time T1, the signal PC is set the low level, the potential of the word line WL connected to the selected cell is set at the high level, and the signal SI is set at the low level. As a result, a read potential is supplied to the memory cells MC. The potentials on the bit lines BL and /BL increase or decrease depending on resistance values that in turn depend on the information in the MTJ elements connected to the bit lines BL and /BL, respectively. In this case, both sense amplifier supply potentials SAP and SAN have a value of Vd/2, so that the sense amplifier does not start operation.

Then, the time passes which is required to adequately change the potentials on bit lines BL and /BL. At a time T2, the signal ISO changes to the low level. Thus, the memory cells MC and the sense amplifier SA are disconnected from each other.

Then, at a time T3, the signals SC2 and SC3 lower to the potential Vss, the signal SC1 rises to the potential Vup, and the signal SC4 rises to the potential Vd. Accordingly, the sense amplifier supply potential SAP rises to the potential Vup. The sense amplifier supply potential SAN lowers to the potential Vss. As a result, the sense amplifier SA starts operation. One of the signals SN and /SN rises to the potential Vup, while the other lowers to the potential Vss. Then, the transistors QN9 and QN10 are turned on (not shown) to load the signals SN and /SN onto the corresponding data lines.

Then, at a time T4, signals SC1 and SC4 lower to the potential Vss, the signal SC2 rises to the potential Vup, and the signal SC3 rises to the potential Vd. Thus, the sense amplifier supply potentials SAP and SAN change to Vd2. Consequently, the sense amplifier SA stops operation. Furthermore, the signals SN and /SN change to the potential Vd/2.

Then, at a time T5, the signal PC changes to the high level, the signal SI changes to the high level, and the word line WL changes to the low level. Thus, the bit lines BL and /BL are precharged to the potential Vd/2.

Subsequently, at a time T6, the signal ISO changes to the high level. The bit lines BL and /BL and the signal lines SN and /SN are connected together to shift the device to a standby state. The operations between the times T1 and T6 define one cycle of read operations. That is, owing to the use of nondestructive reads, the MRAM does not require any rewrite operations, which are required for DRAMs.

According to the magnetic memory device according to the first embodiment of the present invention, after information from the memory cell MCs is loaded onto the bit lines BL and /BL, the memory cells MC and the sense amplifier SA are disconnected from each other. Then, sense amplification is carried out using an overdrive technique. Thus, even if the overdrive changes the potentials on the signal lines SN and /SN to values equal to or larger than Vd, these potentials are not transmitted to the MTJ element MTJ. This avoids applying a high voltage to the opposite ends of the MTJ element MTJ. It is thus possible to enable a read operation with a high margin using the overdrive technique, which is required to activate the sense amplifier in a low voltage operation, while preventing the degradation or destruction of the MTJ element MTJ attributed to the application of a high voltage to the MTJ element MTJ.

(Second Embodiment)

A second embodiment has a circuit configuration similar to that of the first embodiment, and the sense amplifier supply potentials SAP and SAN in the second embodiment are different from those in the first embodiment.

FIG. 5 is a diagram showing the circuit configuration of essential parts of a magnetic memory device according to the second embodiment of the present invention. The circuit in FIG. 5 is similar to that in FIG. 2. Accordingly, only the differences from FIG. 2 will be described below. As shown in FIG. 5, the potential Vd from the potential generating circuit 4b is supplied to the other end of the transistor QP8, which is partly responsible for the control of the sense amplifier supply potential SAP. The potential Vdown (=Vss−Δ) from the potential generating circuit 4d is supplied to the other end of the transistor QN8, which is partly responsible for the control of the sense amplifier supply potential SAN.

Figure 6:
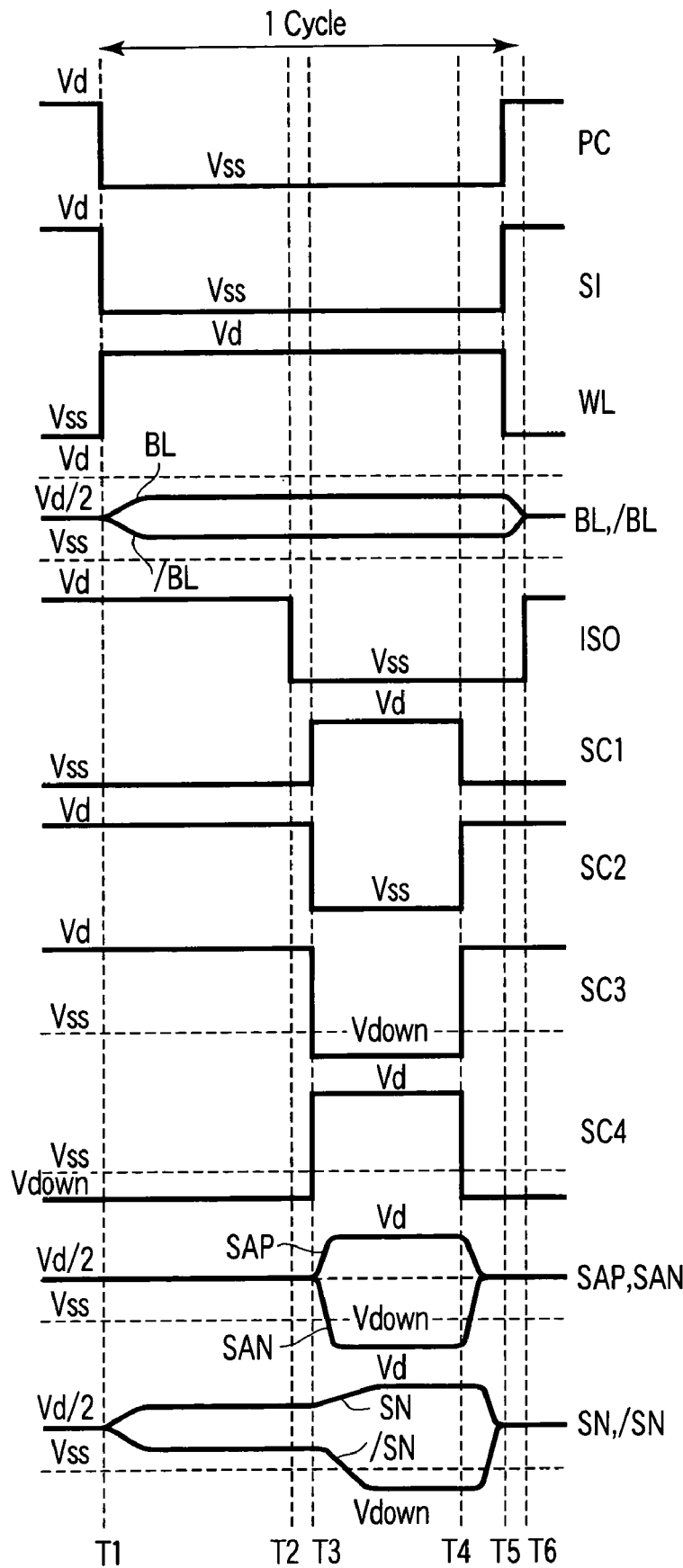
FIG. 6 is a timing chart showing the potentials of essential parts of the magnetic memory device according to the second embodiment of the present invention.

Now, the operation of the magnetic memory device in FIG. 5 will be described with reference to FIG. 6. FIG. 6 is a timing chart showing the potentials of essential parts of the magnetic memory device in FIG. 5. The operations shown in FIG. 6 are similar to those shown in FIG. 4. Accordingly, only the differences will be described. During standby, the signal SC1 has the potential Vss. The signal SC2 has the potential Vd. The signal SC3 has the potential Vd. The signal SC4 has the potential Vdown.

Upon a read, at a time T2, the signal ISO changes to the low level. Then, at time T3, the signal lines SC1 and SC4 rise to the potential Vd, the signal SC2 lowers to the potential Vss, the signal SC3 lower to the potential Vdown. As a result, the sense amplifier SA starts operation. One of the signals SN and /SN rises to the potential Vd, while the other lowers to the potential Vdown. Then, the transistors QN9 and QN10 in FIG. 5 are turned on (not shown). Thus, the signals SN and /SN are loaded onto the corresponding data lines. Subsequently, at a time T4, the signal SC1 lowers to the potential Vss, The signal SC2 rises to the potential Vd, yhe signal SC3 rises to the potential Vd, the signal SC4 lowers to the potential Vdown. Then, as in the case of the first embodiment, after a time T5, at a time T6, the device shifts to the standby state.

With the semiconductor memory device according to the second embodiment of the present invention, the sense amplifier SA uses the potential Vd and the overdriven potential Vdown to amplify the potentials on the signal lines SN and /SN. Thus, after amplification, the difference in potential between the signal lines SN and /SN is larger than the internal power potential Vd−ground potential Vss like in the first embodiment. Furthermore, as with the first embodiment, amplification is carried out after the memory cell MCs and the sense amplifier SA have been disconnected from each other. Thus, as in the case of the first embodiment, it is possible to enable a read operation with a high margin, while preventing the degradation or destruction of the MTJ element MTJ.

(Third Embodiment)

In a third embodiment, the memory cell connection control circuit 1 is not provided. However, the third embodiment is instead characterized by the manner of controlling the potential on the word line WL, in order to prevent a high voltage from being applied to the MTJ element MTJ.

FIG. 7 is a diagram showing the circuit configuration of a magnetic memory device according to the third embodiment of the present invention. As shown in FIG. 7, the memory cell connection control circuit 1 is not provided on the bit lines BL and /BL between the sense amplifier SA and the memory cells MC. The sense amplifier SA and the memory cell MCs are connected all the time.

Figure 8:
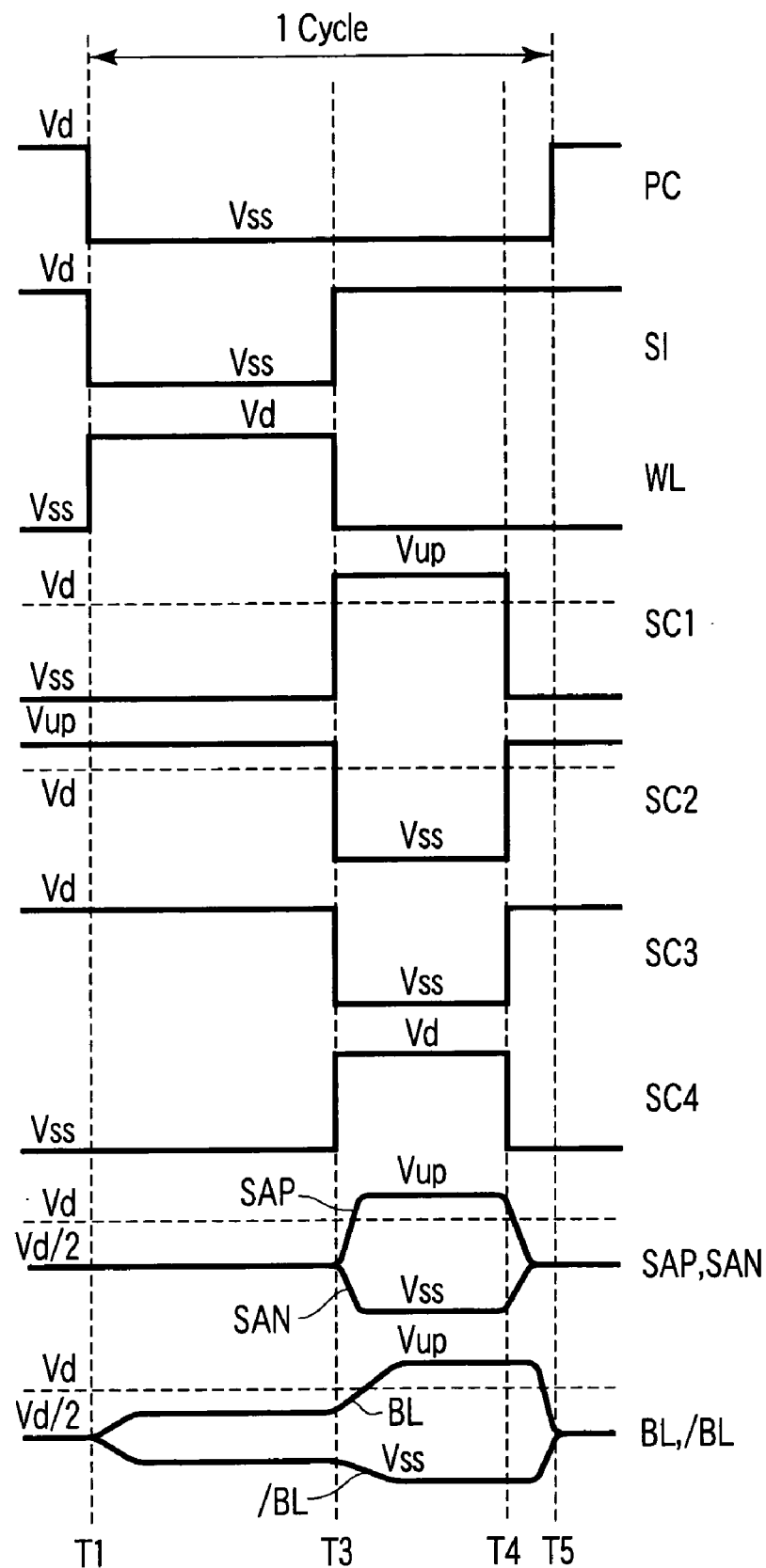
FIG. 8 is a timing chart showing the potentials of essential parts of the magnetic memory device according to the third embodiment of the present invention.

Now, the operation of the magnetic memory device in FIG. 7 will be described with reference to FIG. 8. FIG. 8 is a timing chart showing the potentials of essential parts of the magnetic memory device in FIG. 7. As shown in FIG. 8, the state during standby is the same as that in the first embodiment. Upon a read, at a time T1, the signal PC changes to the low level, the potential on the word line WL connected to the selected cell changes to the high level, the signal SI changes to the low level. As a result, a read voltage is applied to the memory cells MC. The potentials on the bit lines BL and /BL increase or decrease depending on resistance values that in turn depend on the information in the MTJ elements connected to the bit lines BL and /BL. The sense amplifier does not start operation at that point.

After the time passes which is required to adequately change the potentials on the bit lines BL and /BL, the signal SI changes to the high level at a time T3. The word line WL changes to the low level. As a result, the selection transistor Q is turned off to float the memory cell MC. That is, no voltages are applied to the opposite ends of the MTJ element regardless of the changes in the potentials on the bit lines BL and /BL.

Then, at a time T3, the signals SC2 and SC3 lower to the potential Vss, the signal SC1 rises to the potential Vup, and the signal SC4 rises to the potential Vd. Thus, the sense amplifier SA starts operation. Accordingly, one of the bit lines BL and /BL rises to the potential Vup, while the other lowers to the potential Vss. Then, the potentials on the bit lines BL and /BL are loaded onto the corresponding data lines.

Then, at a time T4, signals SC1 and SC4 lower to the potential Vss, the signal SC2 rises to the potential Vup, and The signal SC3 rises to the potential Vd. As a result, the sense amplifier SA stops operation, and the signals SN and /SN change to the potential Vd/2.

Then, at a time T5, the signal PC changes to the high level. Thus, the bit lines BL and /BL are precharged to the potential Vd/2 to shift the device to the standby state.

With the magnetic memory device according to the third embodiment of the present invention, after information from the memory cell has been loaded onto the bit lines BL and /BL, the memory cell MC is floated. Then, sense amplification is carried out using the overdrive technique. Thus, even if the overdrive changes the potentials on the bit lines to values equal to or larger than Vd, it is possible to avoid applying a voltage to the opposite ends of the MTJ element MTJ. This makes it possible to enable a read operation with a high margin using the overdrive technique, while preventing the degradation or destruction of the MTJ element MTJ attributed to the application of a high voltage to the MTJ element MTJ.

(Fourth Embodiment)

According to a fourth embodiment, the sense amplifier supply potentials SAP and SAN vary as in the case of the second embodiment in the circuit configuration of the third embodiment.

FIG. 9 is a diagram showing the circuit configuration of essential parts of a magnetic memory device according to the fourth embodiment of the present invention. The circuit in FIG. 9 is similar to that in FIG. 7. Accordingly, only the differences from FIG. 7 will be described below. As shown in FIG. 9, the potential Vd from the potential generating circuit 4b is supplied to the other end of the transistor QP8. The potential Vdown from the potential generating circuit 4d is supplied to the other end of the transistor QN8.

Figure 10:
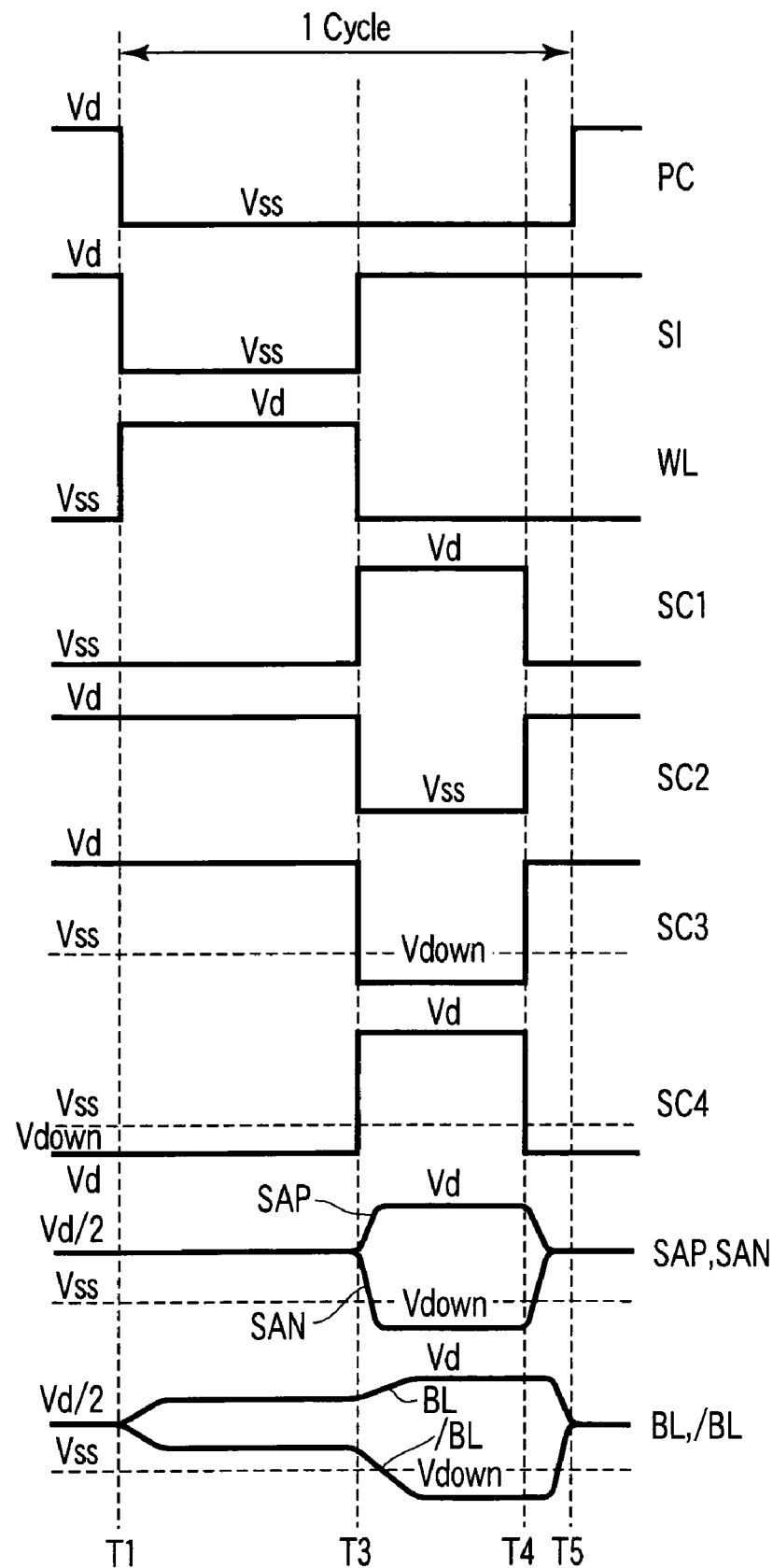
FIG. 10 is a timing chart showing the potentials of essential parts of the magnetic memory device according to the fourth embodiment of the present invention.

Now, the operation of the magnetic memory device in FIG. 9 will be described with reference to FIG. 10. FIG. 10 is a timing chart showing the potentials of essential parts of the magnetic memory device in FIG. 9. The operations shown in FIG. 10 are similar to those shown in FIG. 8. Accordingly, only the differences will be described. During standby, the signal SC1 has the potential Vss. The signal SC2 has the potential Vd. The signal SC3 has the potential Vd. The signal SC4 has the potential Vdown. Upon a read, at a time T3, the signal SI changes to the high level and the word line WL changes to the low level. Consequently, the memory cell MC is floated.

At a time T3, the signal lines SC1 and SC4 rise to the potential Vd, the signal SC2 lowers to the potential Vss, and the signal SC3 lower to the potential Vdown. Thus, the sense amplifier SA starts operation. Consequently, one of the bit lines BL and /BL rises to the potential Vd, while the other lowers to the potential Vdown. The potentials on the bit lines BL and /BL are loaded onto the corresponding data lines. Subsequently, at a time T4, the signal SC1 lowers to the potential Vss, the signal SC2 rises to the potential Vd, the signal SC3 rises to the potential Vd, and the signal SC4 lowers to the potential Vdown. Then, at a time T5, the device shifts to the standby state.

With the semiconductor memory device according to the fourth embodiment of the present invention, the sense amplifier SA uses the potential Vd and the overdriven potential Vdown to amplify the potentials on the bit lines BL and /BL. Thus, after amplification, the difference in potential between the bit lines BL and /BL is larger than the internal power potential Vd−ground potential Vss as in the case of the third embodiment. Furthermore, as with the third embodiment, amplification is carried out after the memory cell MC and the sense amplifier SA have been disconnected from each other. Thus, as in the case of the third embodiment, it is possible to enable a read operation with a high margin, while preventing the degradation or destruction of the MTJ element MTJ.

The first to fourth embodiments have been described with reference to the circuit configuration of the single bit line pair. However, as described in FIG. 1, a plurality of memory cells MC are provided, and actually a large number of bit line pairs are provided in line along a word lines direction. In this case, for example, in accordance with an address signal, only the bit line pair connected to the target memory cell MC is precharged to Vd/2, with the remaining bit line pairs set at the potential Vss. Such control enables the operation of only the sense amplifier SA between the bit lines of the pair connected to the target memory cell MC.

Figure 11:
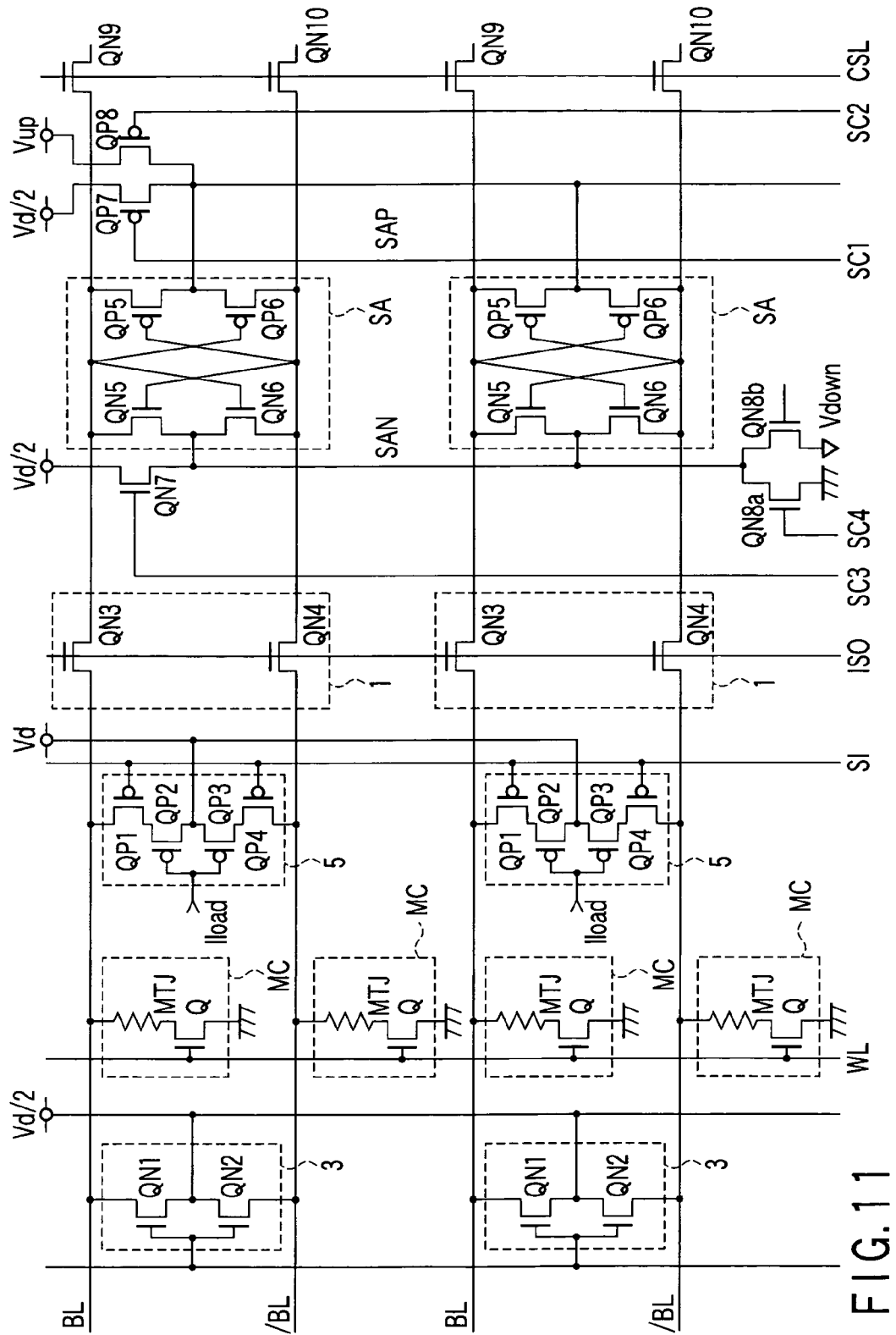
FIG. 11 is a diagram showing a variation of the first and second embodiments.

FIG. 11 shows a circuit configuration with a plurality of bit line pairs provided. As shown in FIG. 11, an arrangement similar to that shown in FIG. 2 is provided in each of two bit line pairs. The sense amplifier supply voltages SAP and SAN are supplied to all the bit lines. The connection node between the transistors QN5 and QN6 is connected to one end of an n-type MOS transistor QN8a and to one end of an n-type MOS transistor QN8b, respectively. The other end of the transistor QN8a is grounded, while the potential Vdown is supplied to the other end of the transistor QN8b. In this figure, the control section 2 and the potential generating circuits 4a to 4d are omitted. This circuit configuration corresponds to the first or second embodiment but may be similarly implemented in the third or fourth embodiment.

Moreover, in each embodiment, the sense amplifier SA overdrives either the potential Vd or the potential Vss for amplification. However, both potentials may be overdriven.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
   a memory cell having an MTJ element, one end of the memory cell selectively electrically connected to a ground potential line;
   a first bit line electrically connected to another end of the memory cell;
   a sense amplifier which amplifies a difference in potential between the first bit line and a second bit line complementary to the first bit line so that the difference is equal to or larger than a difference between an internal power potential and a ground potential;
   a connection circuit which disconnects the MTJ element from an electric connection between the ground potential line and the sense amplifier; and
   a control circuit which controls timing so that the sense amplifier carries out amplification after the connection circuit disconnects the MTJ element from an electric connection between the ground potential line and the sense amplifier.

2. The device according to claim 1, further comprising a complementary memory cell which includes a complementary MJT element having information complementary to information contained in the MTJ element and is connected to the second bit line,
   wherein binary information is stored according to information contained in the memory cell and the complementary memory cell.

3. A magnetic memory device comprising:
   a memory cell having an MTJ element, one end of the memory cell selectively electrically connected to a ground potential line;
   a first bit line electrically connected to another end of the memory cell;
   a sense amplifier which amplifies a difference in potential between the first bit line and a second bit line complementary to the first bit line so that the difference is equal to or larger than a difference between an internal power potential and a ground potential; and
   a switching element provided between the sense amplifier and the MTJ element and disconnecting the MTJ element from an electric connection between the ground potential line and the sense amplifier, wherein one cycle of information reading starts when the MTJ element is connected to the ground potential line, includes disconnection of the switching element and amplification by the sense amplifier, and ends when the switching element is connected.

4. The device according to claim 3, further comprising a control circuit which controls timing so that connection of the MTJ element to the ground potential line, disconnection of the switching element, and amplification by the sense amplifier occur in sequence.

5. A magnetic memory device comprising:
a memory cell having an MTJ element, one end of the memory cell selectively electrically connected to a ground potential line;
a first bit line electrically connected to another end of the memory cell;
a sense amplifier which amplifies a difference in potential between the first bit line and a second bit line complementary to the first bit line so that the difference is equal to or larger than a difference between an internal power potential and a ground potential; and
a switching element provided between the MTJ element and the ground potential line and disconnecting the MTJ element from an electric connection between the ground potential line and the sense amplifier, and being turned off before the sense amplifier carries out amplification, wherein one cycle of information reading starts when precharging between the first bit line and the second bit line is stopped, includes connection of the switching element resulting in changes in potentials on the first bit line and the second bit line and amplification by the sense amplifier starting at disconnection of the switching element, and ends when the precharging is started.

6. The device according to claim 5, further comprising a control circuit which controls timing so that stop of precharging, connection of the switching element, amplification by the sense amplifier, and start of precharging occur in sequence.

7. The magnetic memory device according to claim 1, wherein the connection circuit is a switching element which selectively electrically connects the sense amplifier and the MTJ element.

8. The device according to claim 7, wherein one cycle of information reading starts when the MTJ element is connected to the ground potential line, includes disconnection of the switching element and amplification by the sense amplifier, and ends when the switching element is connected.

9. The device according to claim 7, comprising plurality of said first bit lines and said second bit lines and plurality of said sense amplifiers for pairs of the first bit line and the second bit line, wherein the sense amplifiers are provided with a common control signal for activation of the sense amplifiers.

10. A magnetic memory device comprising:
a memory cell having an MTJ element and a switching element which selectively electrically connects one end of the MTJ element to a ground potential line;
a first bit line electrically connected to the memory cell;
a sense amplifier which amplifies a difference in potential between the first bit line and a second bit line complementary to the first bit line so that the difference is equal to or larger than a difference between an internal power potential and a ground potential; and
a control circuit which disconnects the switching element to float the memory cell before the sense amplifier amplifies the potential difference, wherein one cycle of information reading starts when precharging between the first bit line and the second bit line is stopped, includes connection of the switching element resulting in changes in potentials on the first bit line and the second bit line and amplification by the sense amplifier starting at disconnection of the switching element, and ends when the precharging is started.

11. The device according to claim 10, comprising plurality of said first bit lines and said second bit lines and plurality of said sense amplifiers for pairs of the first bit line and the second bit line, wherein the sense amplifiers are provided with a common control signal for activation of the sense amplifiers.

12. The device according to claim 1, wherein the connection circuit is a switching element provided between the sense amplifier and the MTJ element, and the device further comprises a control circuit which controls timing so that connection of the MTJ element to the ground potential line, disconnection of the switching element, and amplification by the sense amplifier occur in sequence.

13. The device according to claim 1, wherein the connection circuit is a switching element provided between the MTJ element and the ground potential line, the switching element is disconnected before the sense amplifier carries out amplification, and the device further comprises a control circuit which controls timing so that stop of precharging, connection of the switching element, amplification by the sense amplifier, and start of precharging occur in sequence.

14. The device according to claim 1, wherein the MTJ element is kept disconnected from an electric connection between the ground potential line and the sense amplifier after the sense amplifier carries out amplification.

15. The device according to claim 3, further comprising a complementary memory cell which includes a complementary MJT element having information complementary to information contained in the MTJ element and is connected to the second bit line, wherein binary information is stored according to information contained in the memory cell and the complementary memory cell.

16. The device according to claim 5, further comprising a complementary memory cell which includes a complementary MJT element having information complementary to information contained in the MTJ element and is connected to the second bit line, wherein binary information is stored according to information contained in the memory cell and the complementary memory cell.

17. The device according to claim 10, further comprising a complementary memory cell which includes a complementary MJT element having information complementary to information contained in the MTJ element and is connected to the second bit line, wherein binary information is stored according to information contained in the memory cell and the complementary memory cell.

* * * * *